United States Patent
Han et al.

(10) Patent No.: US 9,530,670 B2
(45) Date of Patent: Dec. 27, 2016

(54) METHODS OF FORMING CONDUCTIVE PATTERNS AND METHODS OF MANUFACTURING SEMICONDUCTOR DEVICES USING THE SAME USING AN ETCHANT COMPOSITION THAT INCLUDES PHOSPHORIC ACID, NITRIC ACID, AND AN ASSISTANT OXIDANT

(71) Applicants: Samsung Electronics Co., Ltd., Suwon-si (KR); Soulbrain Co., Ltd., Seongnam-si (KR)

(72) Inventors: Hoon Han, Anyang-si (KR); Byoung-Moon Yoon, Suwon-si (KR); Young-Taek Hong, Hwaseong-si (KR); Keon-Young Kim, Seoul (KR); Jun-Youl Yang, Seoul (KR); Young-Ok Kim, Suwon-si (KR); Tae-Heon Kim, Busan (KR); Sun-Joong Song, Suwon-si (KR); Jung-Hun Lim, Daejeon (KR); Jae-Wan Park, Daegu (KR); Jin-Uk Lee, Daejeon (KR)

(73) Assignees: Samsung Electronics Co., Ltd. (KR); Soulbrain Co., Ltd. (KR)

( * ) Notice: Subject to any disclaimer, the term of this patent is extended or adjusted under 35 U.S.C. 154(b) by 11 days.

(21) Appl. No.: 14/492,122

(22) Filed: Sep. 22, 2014

(65) Prior Publication Data

US 2015/0200112 A1 Jul. 16, 2015

(30) Foreign Application Priority Data

Jan. 10, 2014 (KR) .................. 10-2014-0003344

(51) Int. Cl.

| | |
|---|---|
| H01L 21/20 | (2006.01) |
| H01L 21/36 | (2006.01) |
| H01L 21/3213 | (2006.01) |
| H01L 29/423 | (2006.01) |
| C09K 13/04 | (2006.01) |
| C23F 1/26 | (2006.01) |
| H01L 21/321 | (2006.01) |
| H01L 27/115 | (2006.01) |
| H01L 29/49 | (2006.01) |
| H01L 29/66 | (2006.01) |
| H01L 29/78 | (2006.01) |

(52) U.S. Cl.
CPC ......... *H01L 21/32133* (2013.01); *C09K 13/04* (2013.01); *C23F 1/26* (2013.01);
(Continued)

(58) Field of Classification Search
None
See application file for complete search history.

(56) References Cited

U.S. PATENT DOCUMENTS 7,329,365 B2  2/2008  Cho et al.
8,052,889 B2  11/2011 Lee et al.
(Continued)

FOREIGN PATENT DOCUMENTS

JP  2009-206488  9/2009
JP  2012-156248  8/2012
(Continued)

*Primary Examiner* — Mohammad Islam
*Assistant Examiner* — Jay C Chang
(74) *Attorney, Agent, or Firm* — Myers Bigel, P.A.

(57) ABSTRACT

The present disclosure herein relates to methods of forming conductive patterns and to methods of manufacturing semiconductor devices using the same. In some embodiments, a method of forming a conductive pattern includes forming a first conductive layer and a second conductive layer on a substrate. The first conductive layer and the second conductive layer may include a metal nitride and a metal, respectively. The first conductive layer and the second conductive layer may be etched using an etchant composition that includes phosphoric acid, nitric acid, an assistant oxidant and a remainder of water. The etchant composition may have substantially the same etching rate for the metal nitride and the metal.

14 Claims, 21 Drawing Sheets

(52) U.S. Cl.
CPC .. *H01L 21/32115* (2013.01); *H01L 21/32134* (2013.01); *H01L 27/11582* (2013.01); *H01L 29/4236* (2013.01); *H01L 29/4966* (2013.01); *H01L 29/66666* (2013.01); *H01L 29/7827* (2013.01)

(56) References Cited

U.S. PATENT DOCUMENTS

| | | | |
|---|---|---|---|
| 8,383,473 B1* | 2/2013 | Triyoso | H01L 29/66545 257/E21.444 |
| 8,580,136 B2 | 11/2013 | Ohshiro et al. | |
| 2003/0207513 A1* | 11/2003 | Saitou | H01L 21/32134 438/200 |
| 2013/0115727 A1 | 5/2013 | Park et al. | |
| 2013/0171788 A1* | 7/2013 | Yang | H01L 29/7827 438/268 |
| 2013/0248950 A1* | 9/2013 | Kang | H01L 29/78 257/288 |

FOREIGN PATENT DOCUMENTS

| | | |
|---|---|---|
| KR | 10-2002-0078583 | 10/2002 |
| KR | 10-2010-0037078 | 4/2010 |
| KR | 10-2010-0104360 | 9/2010 |
| KR | 10-2011-0135840 | 12/2011 |
| KR | 10-2012-0052208 | 5/2012 |
| KR | 10-2012-0100516 | 9/2012 |

* cited by examiner

METHODS OF FORMING CONDUCTIVE PATTERNS AND METHODS OF MANUFACTURING SEMICONDUCTOR DEVICES USING THE SAME USING AN ETCHANT COMPOSITION THAT INCLUDES PHOSPHORIC ACID, NITRIC ACID, AND AN ASSISTANT OXIDANT

CROSS-REFERENCE TO RELATED APPLICATION

This application claims the benefit of and priority under 35 U.S.C. §119 to Korean Patent Application No. 10-2014-0003344, filed on Jan. 10, 2014, the contents of which are incorporated by reference herein in their entirety.

FIELD

The present disclosure herein relates to methods of forming conductive patterns, such as, for example, by a wet etching process, and methods of manufacturing semiconductor devices using the same.

BACKGROUND

In a wet etching process for a conductive layer of a semiconductor device, an etchant composition including an acid ingredient may be used. While performing the wet etching process, insulation layers including, e.g., an oxide layer may be damaged and the etching capability of the etchant composition may not be steadily maintained.

SUMMARY

Example embodiments provide methods of forming a conductive pattern having uniform surface characteristics on at least a portion of a surface and/or a uniform shape.

Example embodiments provide methods of manufacturing a semiconductor device including a conductive pattern having uniform surface characteristics on at least a portion of a surface and/or a uniform shape.

In some embodiments, a method of forming a conductive pattern is provided. In some embodiments, the method includes forming a first conductive layer and a second conductive layer on a substrate. The first conductive layer and the second conductive layer include a metal nitride and a metal, respectively. Some embodiments include etching the first conductive layer and the second conductive layer using an etchant composition that includes phosphoric acid, nitric acid, an assistant oxidant and water. In some embodiments, the etchant composition has substantially the same etching rate for both the metal nitride and the metal.

In some embodiments, the etchant composition includes phosphoric acid in an amount in a range of about 50 weight percent to about 80 weight percent, nitric acid in an amount in a range of about 5 weight percent to about 20 weight percent, an assistant oxidant in an amount in a range of about 0.01 weight percent to about 10 weight percent and the remainder of water, based on a total weight of the etchant composition.

In some embodiments, the assistant oxidant includes an acid ammonium-based compound, a halogen acid compound and/or a sulfuric acid-based compound. In some embodiments, the assistant oxidant may be used alone or in combination with one or more different assistant oxidant(s).

In some embodiments, the assistant oxidant includes ammonium sulfate, ammonium persulfate, ammonium acetate, ammonium phosphate, ammonium chloride, periodic acid, iodic acid, sulfuric acid, methanesulfonic acid and/or paratoluene sulfonic acid. In some embodiments, the assistant oxidant may be used alone or in combination with one or more different assistant oxidant(s).

In some embodiments, hydrogen peroxide, acetic acid, a hydroxide (e.g., an ammonium hydroxide) and fluoric acid may be excluded from the etchant composition.

In some embodiments, a conductive pattern including a first conductive layer pattern and a second conductive layer pattern may be formed by etching the first conductive layer and the second conductive layer. In some embodiments, sidewalls of the first conductive layer pattern and the second conductive layer pattern may extend on substantially the same plane.

In some embodiments, an insulation layer pattern is formed using silicon oxide on the substrate. The insulation layer pattern may include an opening. In some embodiments, the first conductive layer may be formed on surfaces of the insulation layer pattern and an innerwall of the opening, and the second conductive layer may be formed on the first conductive layer to fill the opening.

In some embodiments, upper portions of the first conductive layer and the second conductive layer may be etched to form a first conductive layer pattern and a second conductive layer pattern. In some embodiments, the first conductive layer pattern may surround a sidewall and a bottom of the second conductive layer pattern.

In some embodiments, the first conductive layer pattern and the second conductive layer pattern may partially fill the opening such that a recess may be formed at an upper portion of the opening.

In some embodiments, top surfaces of the first conducive layer pattern and the second conductive layer pattern may be coplanar with each other According to some embodiments, a method of manufacturing a semiconductor device is provided. In some embodiments, the method includes forming alternately and repeatedly insulating interlayers and sacrificial layers on a substrate. Some embodiments include forming a plurality of channels through the insulating interlayers and the sacrificial layers. In some embodiments, the insulating interlayers and the sacrificial layers are partially removed to form an opening between adjacent channels in the plurality of channels. In some embodiments, the sacrificial layers exposed by the opening are removed to form a plurality of gaps spaced apart from each other in a vertical direction to a top surface of the substrate. Some embodiments include forming a barrier conductive layer using a metal nitride on surfaces of the insulating interlayers and innerwalls of the plurality of gaps. In some embodiments, a gate electrode layer is formed using a metal on the barrier conductive layer to fill the plurality of gaps. In some embodiments, the barrier conductive layer and the gate electrode layer are etched using an etchant composition that includes phosphoric acid, nitric acid, an assistant oxidant and water. In some embodiments, the etchant composition has substantially the same etching rate for both the metal nitride and the metal.

In some embodiments, a barrier conductive layer pattern and a gate electrode partially filling a gap of the plurality of gaps may be formed by etching the barrier conductive layer and the gate electrode layer. In some embodiments, sidewalls of the barrier conductive layer pattern and the gate electrode may extend on substantially the same plane.

In some embodiments, a recess may be formed at a portion of a gap of the plurality of gaps that is not filled with a barrier conductive layer pattern and a gate electrode. In some embodiments, a filling layer pattern that fills the opening and the recess may be further formed.

In some embodiments, the barrier conductive layer may be formed using titanium nitride, and the gate electrode layer may be formed using tungsten.

In some embodiments, hydrogen peroxide, acetic acid, a hydroxide (e.g., an ammonium hydroxide) and fluoric acid may be excluded from the etchant composition.

According to some embodiments, a method is provided that includes etching a first conductive layer including a metal and a second conductive layer including a metal nitride with a composition including phosphoric acid in an amount in a range of about 50 weight percent to about 80 weight percent, based on a total weight of the etchant composition, nitric acid in an amount in a range of about 5 weight percent to about 20 weight percent, based on the total weight of the etchant composition, and an assistant oxidant in an amount in a range of about 0.01 weight percent to about 10 weight percent, based on the total weight of the etchant composition. In some embodiments, the composition further comprises water. In some embodiments, etching the first conductive layer and the second conductive layer may form a conductive pattern.

In some embodiments, water makes up the remaining weight percent of the etchant composition. In some embodiments, hydrogen peroxide, acetic acid, a hydroxide and fluoric acid are not present in the composition. In some embodiments, the assistant oxidant includes an acid ammonium-based compound, a halogen acid compound, a sulfuric acid-based compound, or any combination thereof.

In some embodiments, the composition etches the metal nitride and the metal at substantially the same etching rate. In some embodiments, the composition etches the first conductive layer and the second conductive layer at substantially the same etching rate. In some embodiments, etching the first conductive layer and the second conductive layer comprises etching the metal nitride and metal at an etching rate ratio in a range of about 0.8 to about 1.1 (metal nitride:metal). In some embodiments, the etching rate ratio may be maintained during the etching step for at least 24 hours.

According to some embodiments of the present inventive concepts, an etchant composition for etching a conductive layer may include phosphoric acid and/or nitric acid. Phosphoric acid and nitric acid may be less volatile than other acid ingredients such as acetic acid. In some embodiments, the contents of the etchant composition and/or an etching capability of the etchant composition may be steadily maintained during an etching process. In some embodiments, maintaining the contents of the etchant composition and/or the etching capability of the etchant composition may increase the length time for using the etchant composition in a process for etching a conductive layer. In some embodiments, if the conductive layer includes a metal nitride layer and a metal layer, a uniform etching rate for both layers may be maintained by implementing and/or using an etchant composition according to various embodiments of the present inventive concepts. In some embodiments, the etchant composition may not include fluoric acid, hydrogen peroxide, and a hydroxide (e.g., an ammonium hydroxide). In some embodiments, an oxide layer and/or semiconductor material may not be damaged during an etching process using an etchant composition according to various embodiments of the present inventive concepts.

BRIEF DESCRIPTION OF THE DRAWINGS

The above and other features and advantages of the disclosure will become more apparent in view of the attached drawings and accompanying detailed description. The drawings provided herein represent non-limiting, example embodiments according to various embodiments of the present inventive concepts.

DETAILED DESCRIPTION

Figure 1:
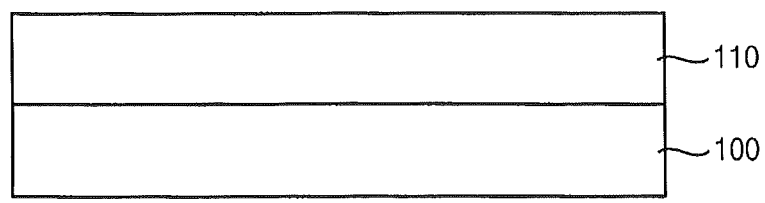
FIGS. 1 to 4 are cross-sectional views illustrating a method of forming a conductive pattern according to various embodiments of the present inventive concepts.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of the present inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this present inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIGS. 1 to 4 are cross-sectional views illustrating a method of forming a conductive pattern according to various embodiments of the present inventive concepts.

Referring to FIG. 1, an insulating interlayer 110 may be formed on a substrate 100.

The substrate 100 may include a semiconductor substrate, e.g., a silicon substrate, a germanium substrate, a silicon-germanium substrate, a silicon-on-insulator (SOI) substrate, a germanium-on-insulator (GOI) substrate, etc.

A lower structure (not illustrated) such as a transistor including a gate structure and an impurity region may be formed on the substrate 100.

The insulating interlayer 110 may be formed on the substrate 100 to cover the lower structure. The insulating interlayer 110 may be formed using silicon oxide, e.g., plasma enhanced oxide (PEOX), tetraethyl orthosilicate (TEOS), boro tetraethyl orthosilicate (BTEOS), phosphorous tetraethyl orthosilicate (PTEOS), boro phospho tetraethyl orthosilicate (BPTEOS), boro silicate glass (BSG), phospho silicate glass (PSG), boro phospho silicate glass (BPSG) or the like. The insulating interlayer 110 may be formed by, e.g., a chemical vapor deposition (CVD) process, a low pressure chemical vapor deposition (LPCVD) process, a plasma enhanced chemical vapor deposition (PECVD) process, a spin coating process, etc.

Figure 2:
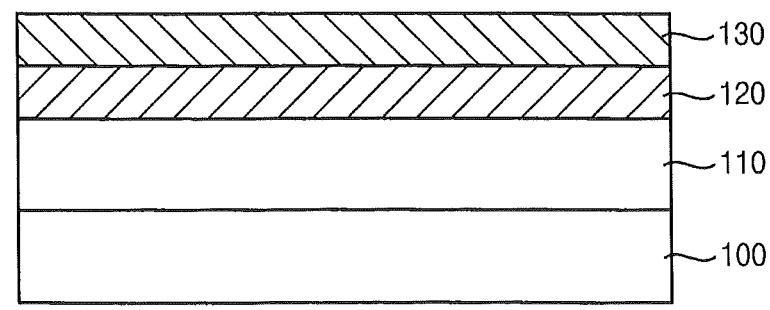

Referring to FIG. 2, a first conductive layer 120 and a second conductive layer 130 may be formed on the insulating interlayer 110.

The first conductive layer 120 and the second conductive layer 130 may be formed using different conductive materials. For example, in some embodiments, the first conductive layer 120 may be formed using a metal nitride, and the second conductive layer 130 may be formed using a metal. Conversely, in some embodiments, the first conductive layer 120 and the second conductive layer 130 may be formed using a metal and a metal nitride, respectively. Hereinafter, detailed descriptions are provided using the example embodiment in which the first conductive layer 120 and the second conductive layer 130 are formed using a metal nitride and a metal, respectively.

Example metals include, but are not limited to, titanium (Ti), tantalum (Ta), tungsten (W), aluminum (Al), copper (Cu), molybdenum (Mo), zirconium (Zr), hafnium (Hf), chromium (Cr) and/or nickel (Ni). A metal may be used alone or in combination with one or more different metal(s). Example metal nitrides include, but are not limited to, titanium nitride, tantalum nitride, tungsten nitride, molybdenum nitride, hafnium nitride and/or zirconium nitride. A metal nitride may be used alone or in combination with one or more different metal(s).

In some embodiments, the first conductive layer 120 and the second conductive layer 130 may be formed using titanium nitride and tungsten, respectively.

The first and second conductive layers 120, 130 may be formed by, e.g., a CVD process, an atomic layer deposition (ALD) process, a sputtering process and/or a physical vapor deposition (PVD) process.

Figure 3:
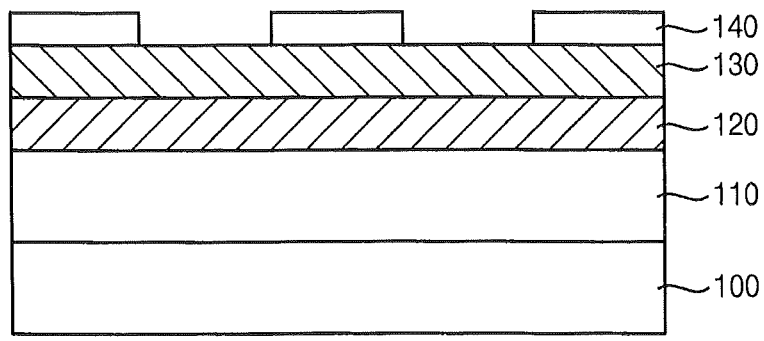

Referring to FIG. 3, a mask pattern 140 may be formed on the second conductive layer 130. A top surface of the second conductive layer 130 may be partially exposed by the mask pattern 140.

In some embodiments, a photoresist material may be coated on the second conductive layer 130, and then exposure and developing processes may be performed to obtain the mask pattern 140. Alternatively, the mask pattern 140 may be formed using silicon-based or carbon-based spin-on hardmask (SOH) materials.

Figure 4:
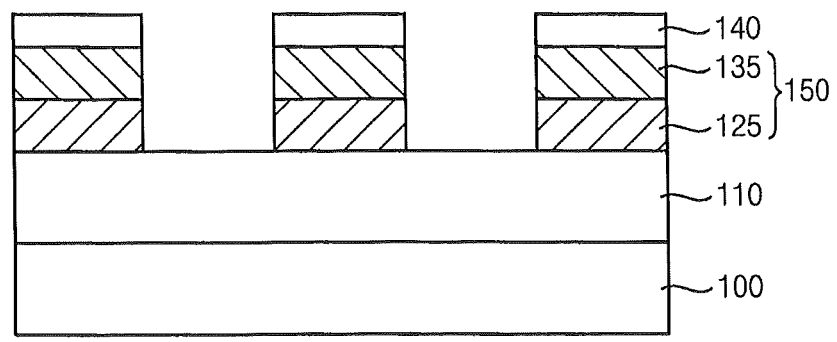

Referring to FIG. 4, the second conductive layer 130 and the first conductive layer 120 may be partially etched using the mask pattern 140 to form a second conductive layer pattern 135 and a first conductive layer pattern 125.

Accordingly, a conductive pattern 150, including the first conductive layer pattern 125 and the second conductive layer pattern 135, stacked on the insulating interlayer 110 may be formed. In some embodiments, the conductive pattern 150 may serve as a conductive structure such as a wiring or a pad electrically connected to a conductive region, e.g., the impurity region formed on the substrate 100.

The first and second conductive layers 120, 130 may be etched by a wet etching process. In some embodiments, an etchant composition for the wet etching process may include phosphoric acid, nitric acid and water. Deionized water or distilled water may be used for the etchant composition. In some embodiments, the etchant composition may further include an assistant oxidant. In some embodiments, the etchant composition may include phosphoric acid, nitric acid, water, and optionally an assistant oxidant, with each component in a given weight percent based on the total weight of the composition. In some embodiments, water may make up the remaining weight percent of the composition. In some embodiments, the composition may comprise, consist essentially of, or consist of phosphoric acid, nitric acid, an assistant oxidant, and water.

In some embodiments, phosphoric acid may serve as the main ingredient. Phosphoric acid may decompose the metal and/or the metal nitride included in the first and/or second conductive layers 120, 130. In some embodiments, nitric acid may serve as an oxidant for oxidizing the metal and/or the metal nitride. In some embodiments, nitric oxide may aid in improving an etching rate by oxidizing the metal and/or the metal nitride.

An assistant oxidant may facilitate the oxidation of the metal and/or the metal nitride. In some embodiments, an assistant oxidant may include an acid ammonium-based compound, a halogen acid compound and/or a sulfuric acid-based compound.

Examples of the acid ammonium-based compound include, but are not limited to, ammonium sulfate, ammonium persulfate, ammonium acetate, ammonium phosphate and/or ammonium chloride. Examples of the halogen acid compound include, but are not limited to, periodic acid and/or iodic acid. Examples of the sulfuric acid-based compound include, but are not limited to, sulfuric acid, methanesulfonic acid and/or paratoluene sulfonic acid. An assistant oxidant may be used alone or in combination with one or more different assistant oxidant(s).

In some embodiments, the etchant composition may include phosphoric acid in an amount in a range of about 50 weight percent to about 80 weight percent, nitric acid in an amount in a range of about 5 weight percent to about 20 weight percent, optionally an assistant oxidant in an amount in range of about 0.01 weight percent to about 10 weight percent and a remainder of water, based on the total weight of the etchant composition.

In some embodiments, the etchant composition may not include hydrogen peroxide ($H_2O_2$), acetic acid, a hydroxide (e.g., an ammonium hydroxide) and/or fluoric acid.

Hydrogen peroxide may have a great etching rate for a metal material. However, if the etchant composition includes hydrogen peroxide, uniform or equal etching rates for the metal nitride and the metal may not be achieved and/or maintained.

Acetic acid may be significantly volatile and thus easily evaporated during a wet etching process. Accordingly, if the etchant composition includes acetic acid, contents or a composition ratio of the etchant composition may change during a wet etching process and/or the etchant composition may have a short etching lifetime.

Fluoric acid may have a great etching rate for oxides such as silicon oxide. Thus, fluoric acid may undesirably etch an insulation layer, such as, for example, an insulation layer including silicon oxide.

If the etchant composition includes a hydroxide (e.g., an ammonium hydroxide), a semiconductor material such as polysilicon may be also etched. Example hydroxides include, but are not limited to, ammonium hydroxide ($NH_4OH$), tetramethyl ammonium hydroxide (TMAH), tetraethyl ammonium hydroxide (TEAH), sodium hydroxide NaOH and/or potassium hydroxide (KOH).

In some embodiments, hydrogen peroxide, fluoric acid, a hydroxide (e.g., an ammonium hydroxide) and acetic acid may be excluded from the etchant composition, and the first and second conductive layers 120, 130 may be etched using phosphoric acid, nitric acid and/or an assistant oxidant. In some embodiments, the contents and/or the composition ratio of the etchant composition may be substantially constant during a wet etching process. Thus, in some embodiments, the etching rates for the first conductive layer 120 and the second conductive layer 130 may be steadily maintained. In some embodiments, an insulation layer including, e.g., silicon oxide and/or a semiconductor material may be prevented from being damaged by the wet etching process by using an etchant composition including phosphoric acid, nitric acid and/or an assistant oxidant.

In some embodiments, an etching rate ratio of the metal nitride relative to the metal by using an etchant composition according to the present inventive concepts may be maintained in a range of about 0.8 to about 1.1. In some embodiments, the etching rate ratio may be maintained in a range of about 0.9 to about 1.05.

Referring again to FIGS. 3 and 4, the etchant composition may have substantially the same etching rate for the first conductive layer 120 and the second conductive layer 130. Thus, a sidewall of the conductive pattern 150 may have a uniform profile or morphology. For example, sidewalls of the first and second conductive patterns 125, 135 may extend on substantially the same plane.

In some embodiments, the first and second conductive layers 120, 130 may be selectively etched without damaging the insulating interlayer 110.

FIGS. 5 to 8 are cross-sectional views illustrating a method of forming a conductive pattern according to various embodiments of the present inventive concepts. Detailed descriptions on processes and/or materials substantially the same as or similar to those discussed and/or illustrated with reference to FIGS. 1 to 4 are omitted herein for brevity.

Figure 5:
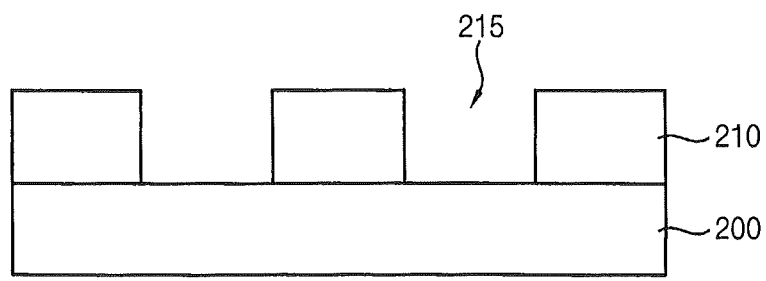
FIGS. 5 to 8 are cross-sectional views illustrating a method of forming a conductive pattern according to various embodiments of the present inventive concepts.

Referring to FIG. 5, an insulation layer pattern 210 may be formed on a substrate 200.

In some embodiments, an insulation layer may be formed on the substrate 200 using the above mentioned silicon oxide by a CVD process. The insulation layer may be partially removed by a photolithography process to form the insulation layer pattern 210. An opening 215 may be formed at a space from which the insulation layer is removed.

In some embodiments, a lower insulation layer (not illustrated) including a silicon oxide-based material may be further formed on the substrate 200. In this case, a top surface of the lower insulation layer may be exposed by the opening 215.

Figure 6:
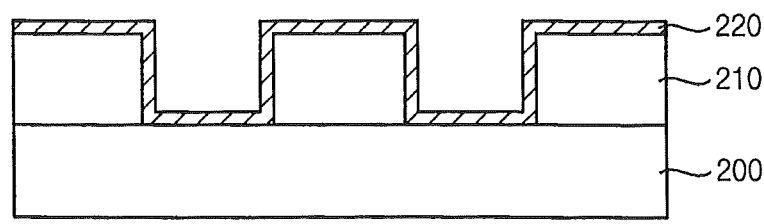

Referring now to FIG. 6, a first conductive layer 220 may be formed conformably on a top surface of the insulation layer pattern 210, a sidewall of the opening 215 and a bottom of the opening 215. In some embodiments, the first conductive layer 220 may be formed using a metal nitride. In some embodiments, the first conductive layer 220 may be formed using titanium nitride.

Figure 7:
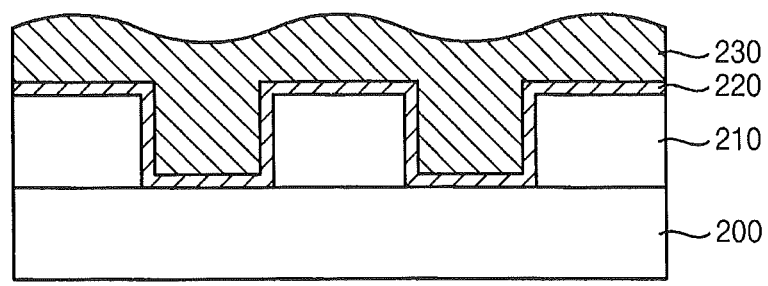

Referring to FIG. 7, a second conductive layer 230 filling the opening 215 may be formed on the first conductive layer 220. In some embodiments, the second conductive layer 230 may be formed using a metal. In some embodiments, the second conductive layer 230 may be formed using tungsten.

Figure 8:
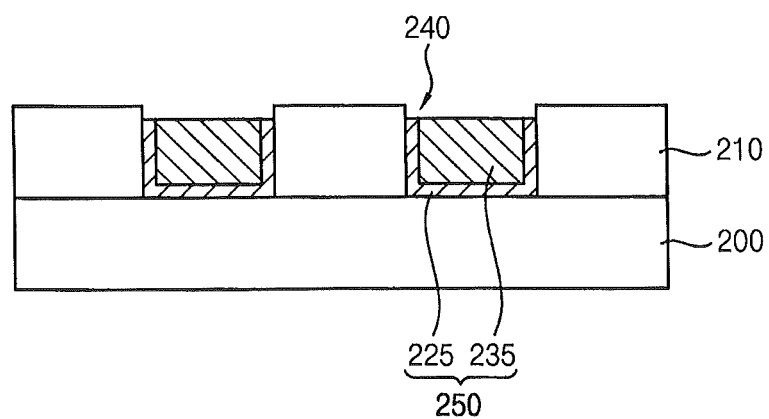

Referring to FIG. 8, upper portions of the first and second conductive layers 220, 230 may be etched using an etchant composition according to various embodiments of the present inventive concepts, as described above, to form a conductive pattern 250 including a first conductive layer pattern 225 and a second conductive layer pattern 235. The first conductive layer pattern 225 may surround a bottom and a sidewall of the second conductive layer pattern 235. The top surface of the insulation layer pattern 210 may be exposed again on forming the conductive pattern 250.

As described above, the etchant composition may have substantially the same etching rate for both the metal nitride and the metal. Thus, in some embodiments, the conductive pattern 250 may have a substantially leveled and/or planar top surface. For example, top surfaces of the first and second conductive patterns 225, 235 may be coplanar with each other.

In some embodiments, the top surface of the conductive pattern 250 may be lower than the top surface of the insulation layer pattern 210. Accordingly, a short-circuit between the neighboring conductive patterns 250 may be prevented. A recess 240 may be defined by the conductive pattern 250 and the insulation layer pattern 210.

FIGS. 9 to 20 are cross-sectional views illustrating a method of manufacturing a semiconductor device according to various embodiments of the present inventive concepts. For example, FIGS. 9 to 20 illustrate a method of manufacturing a vertical semiconductor device that may include a vertical channel.

Figure 9:
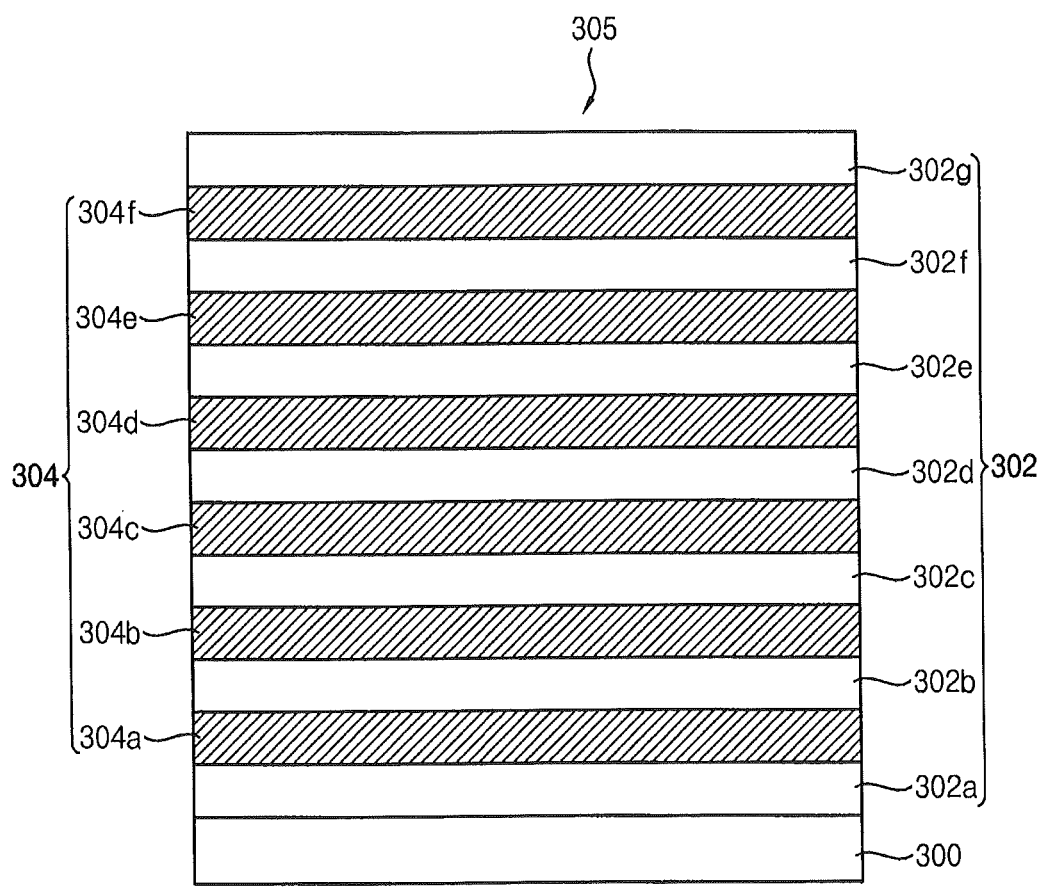
FIGS. 9 to 20 are cross-sectional views illustrating a method of manufacturing a semiconductor device according to various embodiments of the present inventive concepts.

Referring to FIG. 9, insulating interlayers 302 and sacrificial layers 304 may be formed alternately and repeatedly on a substrate 300 to form a mold structure 305.

The substrate 300 may include a semiconductor material, e.g., single crystalline silicon and/or germanium.

The insulating interlayers 302 may be formed using an oxide, e.g., silicon dioxide, silicon carbooxide (SiOC) and/or silicon fluorooxide (SiOF). The sacrificial layers 304 may be formed using a material that may have a high etching selectivity with respect to the insulating interlayers 302 and/or may be easily removed by a wet etching process. The sacrificial layers 304 may be formed using a nitride-based material, e.g., a silicon nitride and/or silicon boronitride (SiBN).

The insulating interlayers 302 and the sacrificial layers 304 may be formed using a CVD process, a PECVD process, a spin coating process, etc. A lowermost insulating interlayer 302*a* may be formed by a thermal oxidation process.

The sacrificial layers 304 may be removed in a subsequent process to provide space for a ground selection line (GSL), a word line and/or a string selection line (SSL). Thus, the number of the insulating interlayers 302 and the sacrificial layers 304 may be adjusted in consideration of the number of the GSL, the word line and/or the SSL. In some embodiments, each of the GSL and the SSL may be formed at a single level, and the word line may be formed at 4 levels. Accordingly, the sacrificial layers 304 may be formed at 6 levels, and the insulating interlayers 302 may be formed at 7 levels. In some embodiments, each of the GSL and the SSL may be formed at 2 levels, and the word line may be formed at 2, 8 or 16 levels. In this case, the sacrificial layers 304 may be formed at 6, 12 or 20 levels, and the insulating interlayers 302 may be formed at 7, 13 or 21 levels. However, the number of the GSL, the SSL and/or the word line may not be limited herein.

Figure 10:
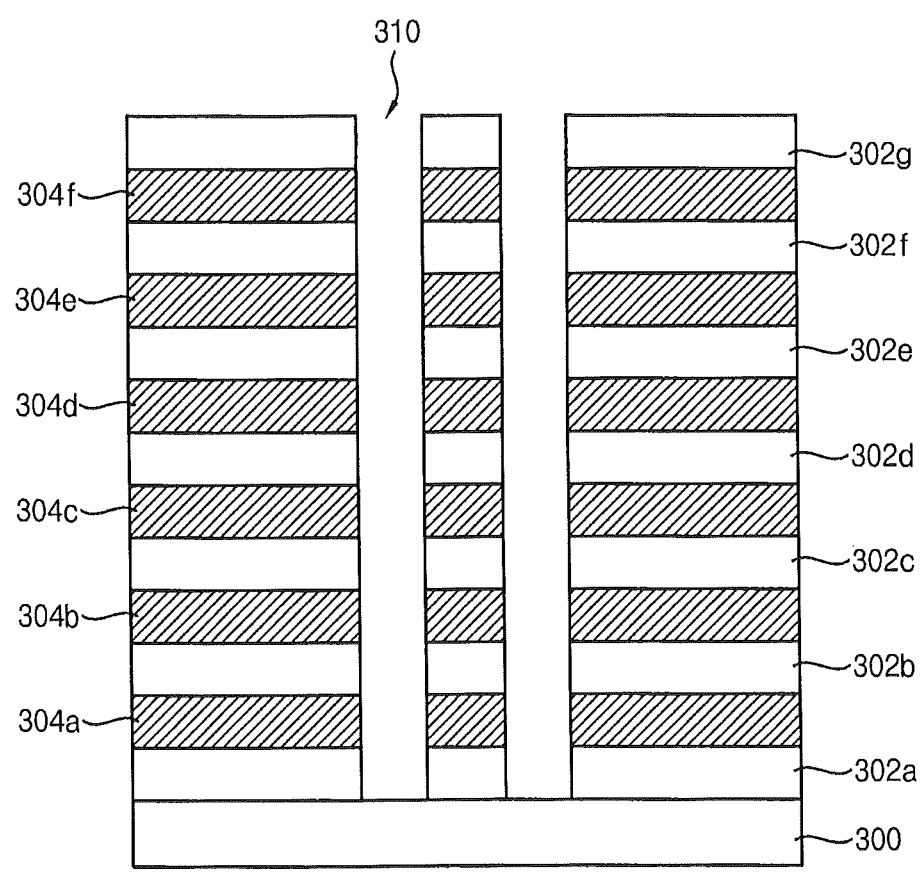

Referring now to FIG. 10, a channel hole 310 may be formed through the mold structure 305.

In some embodiments, a hard mask (not illustrated) may be formed on an uppermost insulating interlayer 302*g*. The insulating interlayers 302 and the sacrificial layers 304 may be partially removed using the hard mask as an etching mask to form the channel hole 310. A top surface of the substrate 300 may be exposed by the channel hole 310, and the channel hole 310 may extend in a vertical direction with respect to the top surface of the substrate 300. A sidewall of the channel hole 310 may be substantially vertical with respect to the top surface of the substrate 300. However, the sidewall of the channel hole 310 may be tapered with respect to the top surface of the substrate 300 due to characteristics of a dry etching process.

The hard mask may be formed using a material having an etching selectivity with respect to the insulating interlayers 302 and the sacrificial layers 304. For example, the hard mask may be formed using polysilicon or amorphous silicon. In some embodiments, the hard mask may be formed using silicon-based or carbon based SOH materials. The hard mask may be removed by, e.g., an ashing process and/or a strip process after the formation of the channel holes 310.

FIG. 10 illustrates two channel holes 310. In some embodiments, a plurality of channel holes 310 may be formed to define a channel hole row. In some embodiments, the plurality of the channel hole rows may be formed to define a channel hole array.

Figure 11:
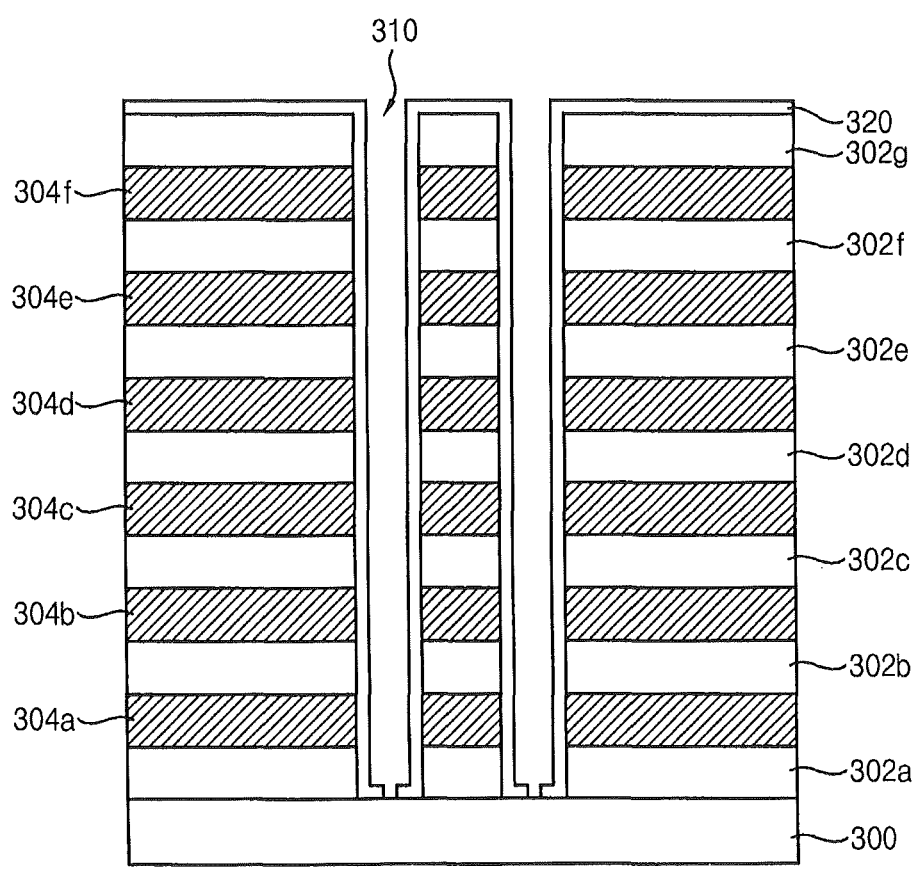

Referring to FIG. 11, a dielectric layer 320 may be formed on a sidewall and a bottom of the channel hole 310 and on the uppermost insulating interlayer 302*g*.

In some embodiments, the dielectric layer 320 may have a multi-stacked structure including a first blocking layer, a charge storage layer and a tunnel insulation layer.

The first blocking layer may be formed using an oxide, e.g., silicon oxide, the charge storage layer may be formed using silicon nitride or a metal oxide, and the tunnel insulation layer may be formed using an oxide, e.g., silicon oxide. In some embodiments, the dielectric layer 320 may have an oxide-nitride-oxide (ONO) layer structure. The first blocking layer, the charge storage layer and the tunnel insulation layer may be formed by a CVD process, a PECVD process, an ALD process, etc.

A bottom of the dielectric layer 320 may be partially removed by, e.g., an etch-back process. Accordingly, the bottom of the dielectric layer 320 may be opened in the channel holes 310, and the top surface of the substrate 300 may be exposed through the channel hole 310.

Figure 12:
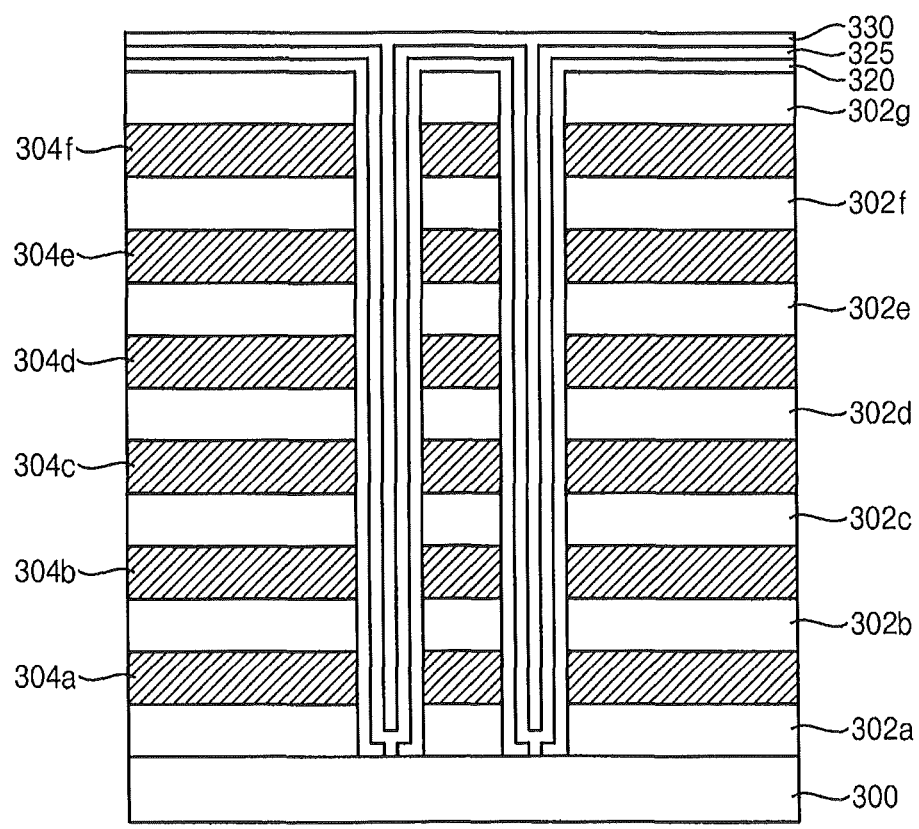

Referring to FIG. 12, a channel layer 325 may be formed on the dielectric layer 320 and the exposed top surface of the substrate 300, and then a first filling layer 330 may be formed on the channel layer 325 to fill a remaining portion of the channel hole 310. The channel layer 325 may be formed using polysilicon or amorphous silicon which may optionally be doped with impurities. In some embodiments, a heat treatment or a laser beam irradiation may be further performed on the channel layer 325. In this case, the channel layer 325 may include single crystalline silicon and defects in the channel layer 325 may be cured. The first filling layer 330 may be formed using an insulation material, e.g., silicon oxide or silicon nitride. The channel layer 325 and the first filling layer 330 may be formed by a CVD process, a PECVD process, an ALD process, etc.

In some embodiments, the channel layer 325 may be formed to fully fill the channel hole 310. In this case, the formation of the first filling layer 330 may be omitted.

Figure 13:
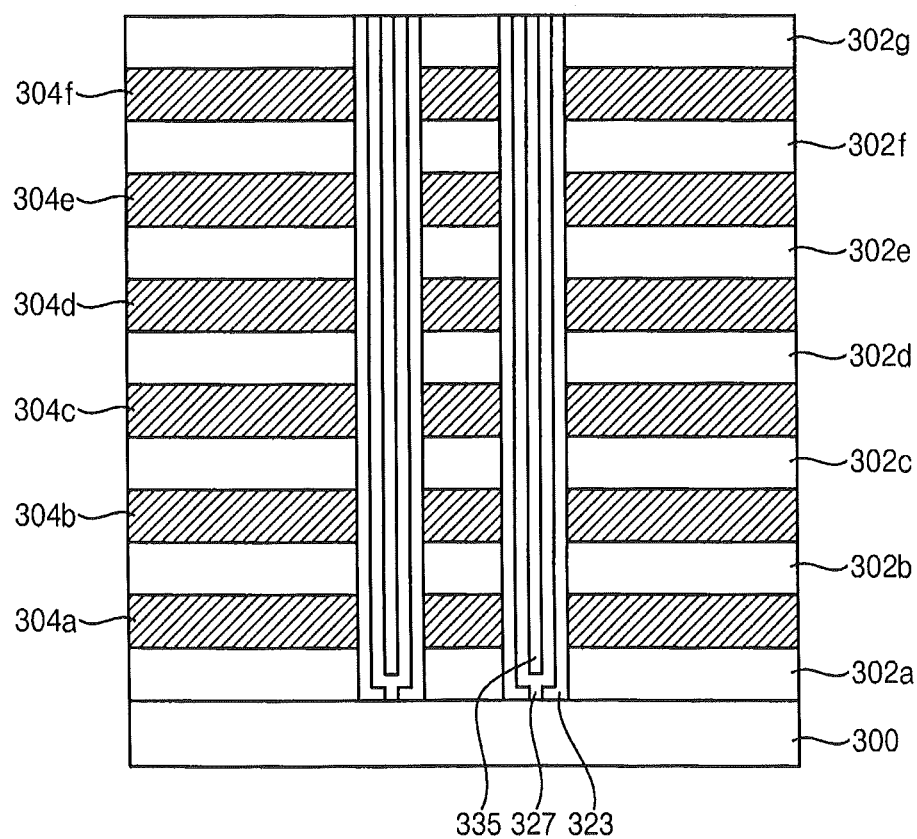

Referring to FIG. 13, the first filling layer 330, the channel layer 325 and the dielectric layer 320 may be planarized until the uppermost insulating interlayer 302*g* is exposed to form a dielectric layer structure 323, a channel 327 and a first filling layer pattern 335 sequentially stacked in the channel hole 310. The planarization process may include an etch-back process or a chemical mechanical polish (CMP) process.

In some embodiments, the dielectric layer structure 323 may have a substantially hollow cylindrical shape or a straw shape. The channel 327 may have a substantially cup shape. The first filling layer pattern 335 may have a substantially solid cylindrical shape or a substantially pillar shape.

In some embodiments, if the channel layer 325 fully fills the channel hole 310, the first filling layer pattern 335 may be omitted and the channel 327 may have a substantially solid cylindrical shape or a substantially pillar shape.

A plurality of the channels 327 filling the channel holes 310 may be formed, such that a channel row and a channel array may be defined comparable to the channel hole row and the channel hole array.

Figure 14:
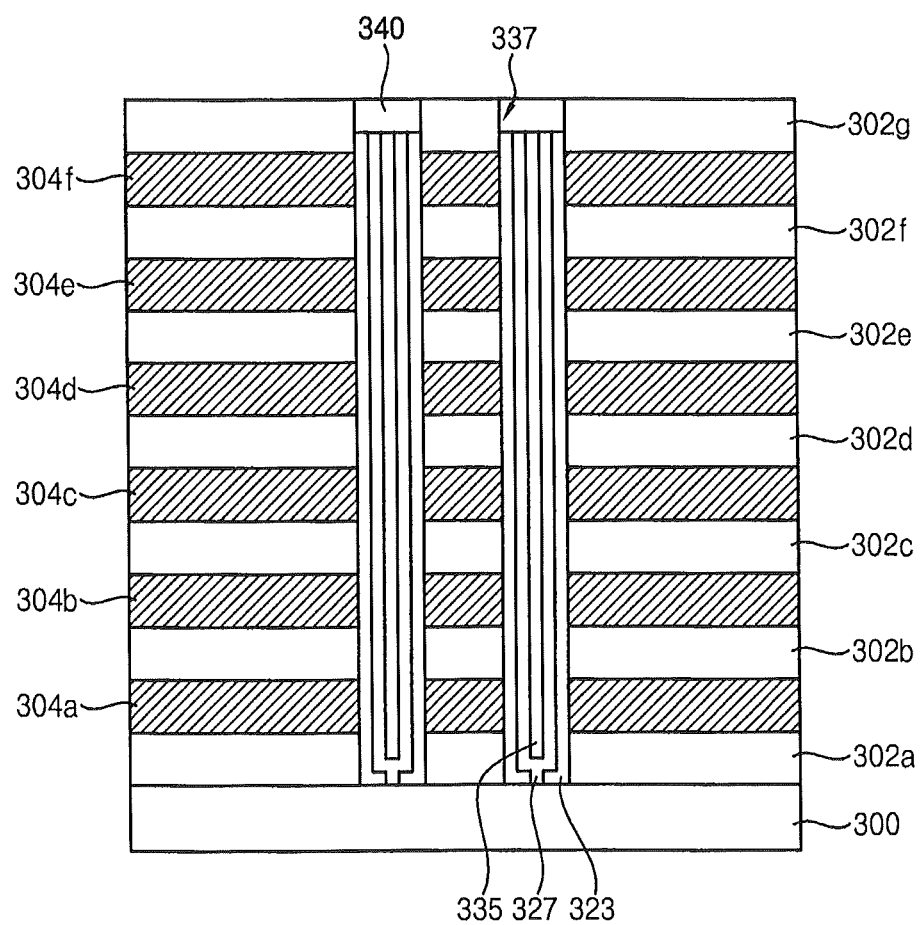

Referring to FIG. 14, a pad 340 capping an upper portion of the channel hole 310 may be formed on the dielectric layer structure 323, the channel 327 and the first filling layer pattern 335.

In some embodiments, upper portions of the dielectric layer structure 323, the channel 327 and the first filling layer pattern 335 may be removed by an etch-back process to form a recess 337. A bottom of the recess 337 may be higher than a top surface of an uppermost sacrificial layer 304f. A pad layer filling the recess 337 may be formed on the dielectric layer structure 323, the channel 327, the first filling layer pattern 335 and the uppermost insulating interlayer 302g. An upper portion of the pad layer may be planarized until a top surface of the uppermost insulating interlayer 302g is exposed to obtain the pad 340. In some embodiments, the pad layer may be formed using polysilicon optionally doped with n-type impurities by, e.g., a CVD process. In some embodiments, a preliminary pad layer may be formed using amorphous silicon, and then a crystallization process may be performed thereon to form the pad layer. The planarization process may include a CMP process.

Figure 15:
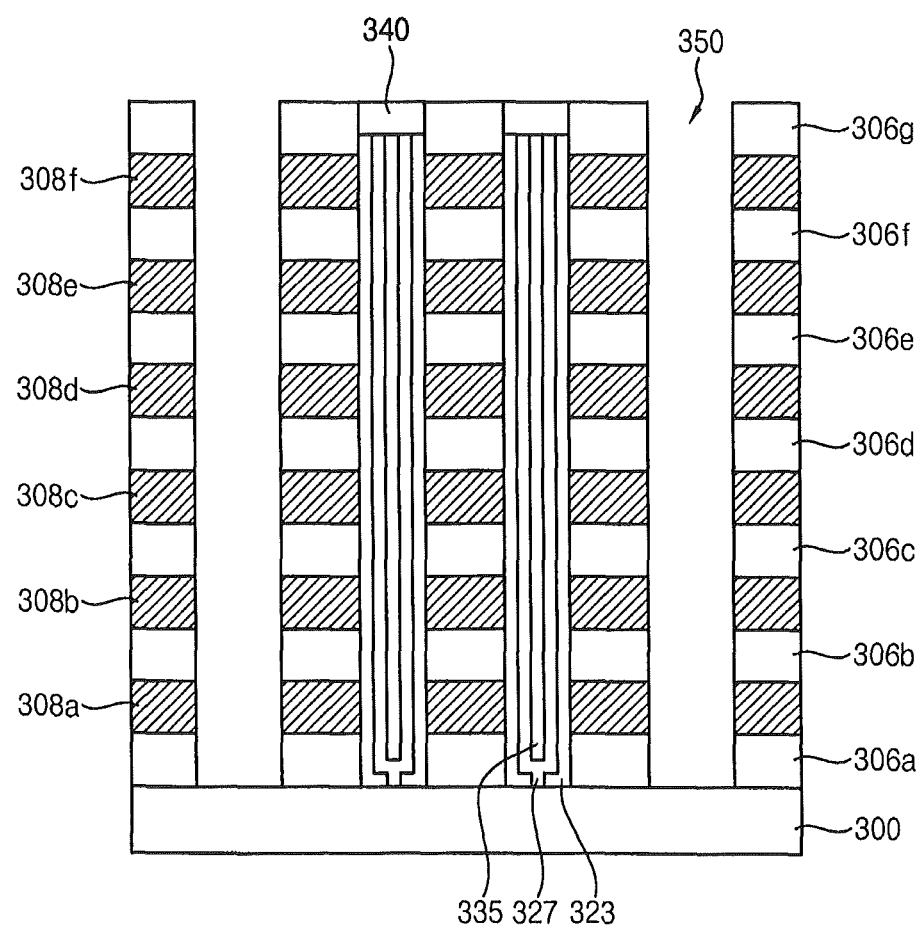

Referring to FIG. 15, the mold structure 305 may be partially etched to form openings 350.

For example, a mask pattern (not illustrated) covering the pads 340 may be formed on the uppermost insulating interlayer 302g. A dry etching process may be performed using the mask pattern as an etching mask, such that portions of the insulating interlayers 302 and the sacrificial layers 304 between the neighboring channel rows may be removed to form the openings 350. The hard mask may be formed using a photoresist material or an SOH material. The hard mask may be removed by an ashing process and/or a strip process after the formation of the openings 350.

The insulating interlayers 302 and the sacrificial layers 304 may be changed into insulating interlayer patterns 306 and sacrificial layer patterns 308, respectively, by the formation of the openings 350. The insulating interlayer patterns 306 and the sacrificial layer patterns 308 may have a linear shape surrounding at least one of the channel rows. The opening 350 may serve as a gate electrode cut region by which gate electrodes 370 (see FIG. 18) are separated per each level.

Figure 16:
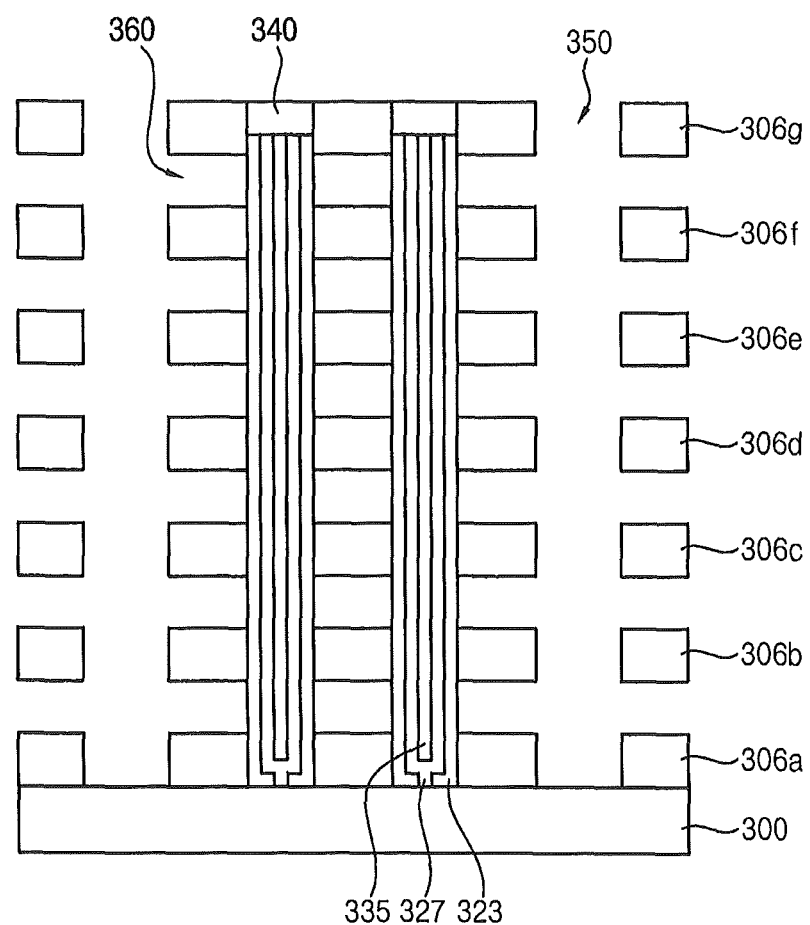

Referring to FIG. 16, the sacrificial layer patterns 308, sidewalls of which are exposed by the opening 350 may be removed. For example, the sacrificial layer patterns 308 may be removed by a wet etching process using an etchant solution that may have an etching selectivity for silicon nitride. In some embodiments, the etchant solution may include sulfuric acid.

By the removal of the sacrificial layer patterns 308, gaps 360 may be defined between the insulating interlayer patterns 306 adjacent in the vertical direction. An outer sidewall of the dielectric layer structure 323 may be partially exposed by the gap 360.

Figure 17:
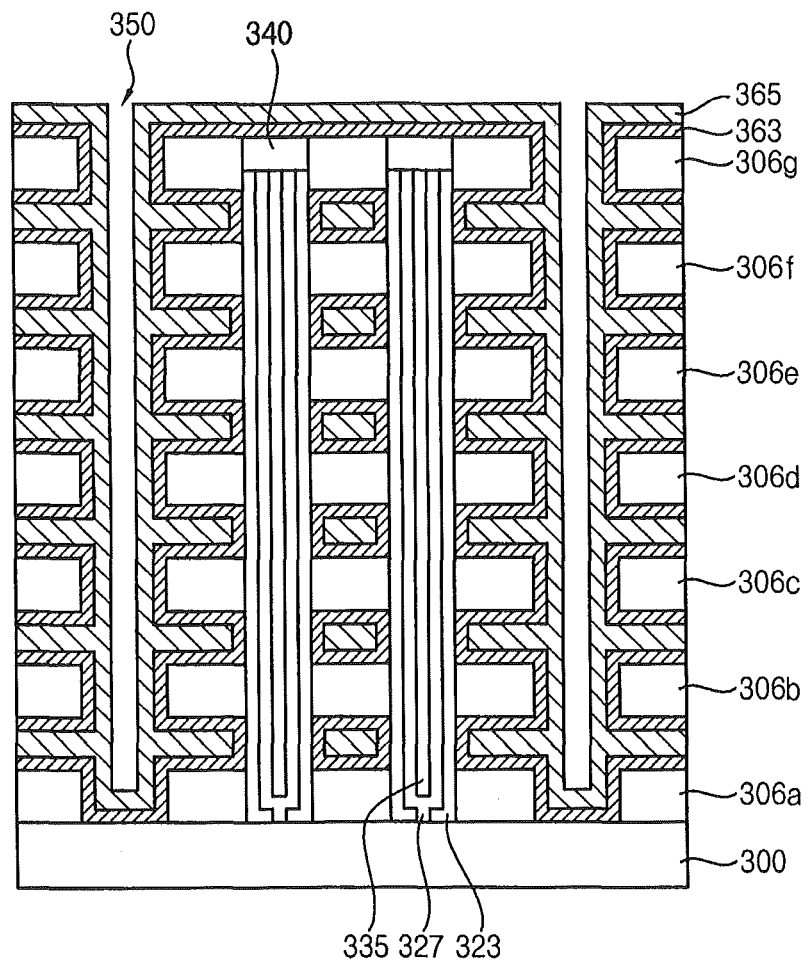

Referring to FIG. 17, a barrier conductive layer 363 may be formed on the outer sidewall of the dielectric layer structure 323, an innerwall of the gap 360, a top surface of the pad 340, surfaces of the insulating interlayer patterns 306 and the top surface of the substrate 300. A gate electrode layer 365 may be formed on the barrier conductive layer 363. In some embodiments, the gate electrode layer 365 may fill the gaps 360 and may partially fill the openings 350.

In some embodiments, the barrier conductive layer 363 may be formed using a metal nitride, e.g., titanium nitride, tantalum nitride, tungsten nitride, molybdenum nitride, hafnium nitride and/or zirconium nitride. In some embodiments, the gate electrode layer 365 may be formed using a metal, e.g., titanium, tantalum, tungsten, aluminum, copper, molybdenum, zirconium, hafnium, chromium and/or nickel. In some embodiments, the barrier conductive layer 363 and the gate electrode layer 365 may be formed using titanium nitride and tungsten, respectively.

The barrier conductive layer 363 and the gate electrode layer 365 may be formed by a sputtering process, an ALD process, a CVD process and/or a PVD process.

In some embodiments, a second blocking layer may be further formed using, e.g., silicon oxide before forming the barrier conductive layer 363.

Figure 18:
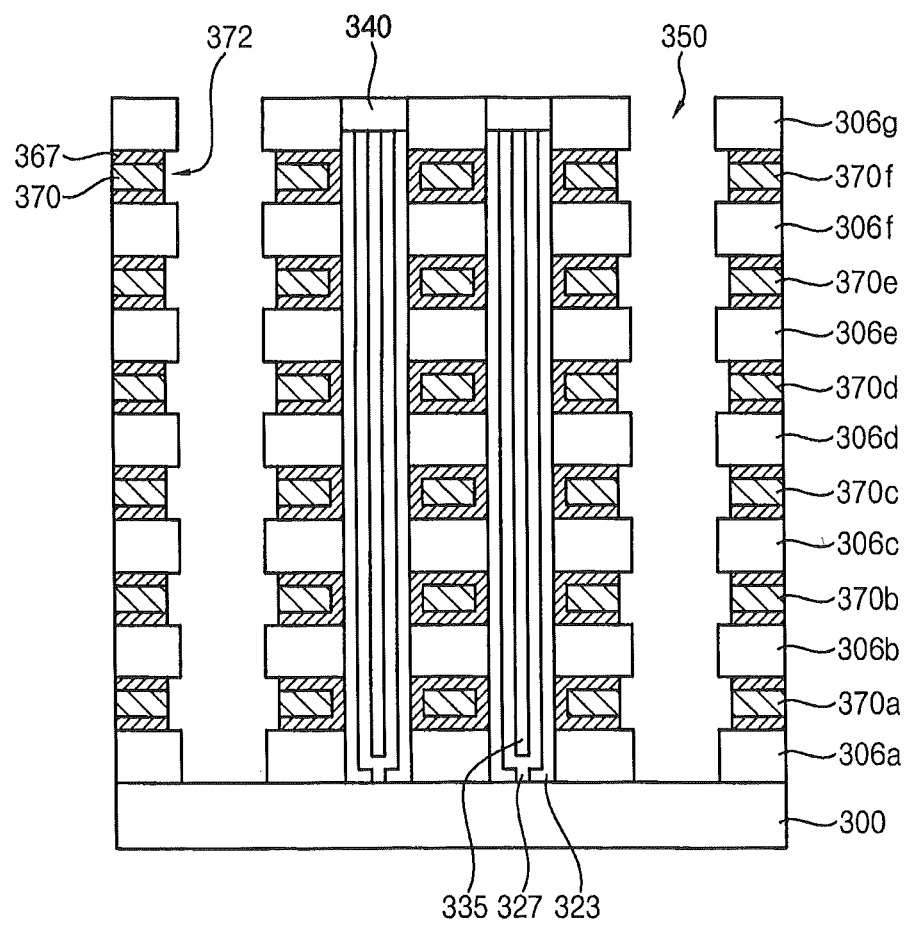

Referring to FIG. 18, the barrier conductive layer 363 and the gate electrode layer 365 may be partially etched to form a barrier conductive layer pattern 367 and a gate electrode 370 in the gap 360 of each level. The barrier conductive layer pattern 367 and the gate, electrode 370 may have a linear shape surrounding the channels 327 included in the channel row.

In some embodiments, upper portions of the barrier conductive layer 363 and the gate electrode layer 365 may be planarized by, e.g., a CMP process until a top surface of an uppermost insulating interlayer pattern 306g is exposed. The top surface of the pad 340 may also be exposed by the planarization process. Portions of the barrier conductive layer 363 and the gate electrode layer 365 formed in the opening 350 may be etched to form the barrier conductive layer pattern 367 and the gate electrode 370 in each gap 360. The barrier conductive layer pattern 367 may be formed on the innerwall of the gap 360, and the gate electrode 370 may be formed on the barrier conductive layer pattern 367 to fill the gap 360.

The etching process for the barrier conductive layer 363 and the gate electrode layer 365 may include a wet etching process using an etchant composition according to various embodiments of the present inventive concepts, as described above. In some embodiments, the etchant composition may include phosphoric acid, nitric acid and water. In some embodiments, the etchant composition may further include an assistant oxidant. The assistant oxidant may include ammonium sulfate, ammonium persulfate, ammonium acetate, ammonium phosphate, ammonium chloride, periodic acid, iodic acid, methanesulfonic acid and/or paratoluene sulfonic acid. An assistant oxidant may be used alone or in combination with one or more different assistant oxidant(s).

In some embodiments, the etchant composition may include phosphoric acid in an amount in a range of about 50 weight percent to about 80 weight percent, nitric acid in an amount in a range of about 5 weight percent to about 20 weight percent, optionally an assistant oxidant in an amount in range of about 0.01 weight percent to about 10 weight percent and a remainder of water, based on the total amount of the etchant composition.

In some embodiments, the etchant composition may not include hydrogen peroxide, acetic acid, a hydroxide (e.g., an ammonium hydroxide) and/or fluoric acid.

In some embodiments, the etchant composition may have substantially the same etching rate for both the metal nitride and the metal. Accordingly, in some embodiments, the barrier conductive layer 363 and the gate electrode layer 365 may be etched with substantially the same etching rate by a wet etching process. In some embodiments, the etchant composition may not include hydrogen peroxide, a hydroxide and fluoric acid, so the pad 340 and the insulating interlayer patterns 306 may not be damaged and/or etched by the wet etching process.

In some embodiments, portions of the barrier conductive layer 363 and the gate electrode layer 365 formed in the gap 360 may be partially etched so that a short-circuit of the barrier conductive layer patterns 367 and the gate electrodes 370 in the neighboring gaps 360 may be prevented. Thus, the barrier conductive layer patterns 367 and the gate electrodes 370 may partially fill the gap 360, and a portion of the gap 360 which is not filled with the barrier conductive layer pattern 367 and the gate electrode 370 may be defined as a recess 372 (FIG. 18).

In some embodiments, sidewalls of the barrier conductive layer pattern 367 and the gate electrode 370 may extend on substantially the same plane because the barrier conductive layer 363 and the gate electrode layer 365 may be etched with substantially the same etching rate by the etchant composition.

The gate electrodes 370 may include the GSL, the word line and/or the SSL sequentially stacked and spaced apart from each other in the vertical direction. For example, referring again to FIG. 18, in some embodiments, a lowermost gate electrode 370a may serve as the GSL. Four gate electrodes 370b, 370c, 370d and 370e on the GSL may serve as the word lines. An uppermost gate electrode 370f on the word line may serve as the SSL. However, the stacked number of the GSL, the word line and the SSL may be properly adjusted in consideration of a circuit design and a degree of integration of the vertical memory device.

In some embodiments, if the second blocking layer is formed before forming the barrier conductive layer 363, a second blocking layer pattern may be formed in each gap 360, and the barrier conductive layer pattern 367 and the gate electrode 370 may be formed on the second blocking layer pattern.

Figure 19:
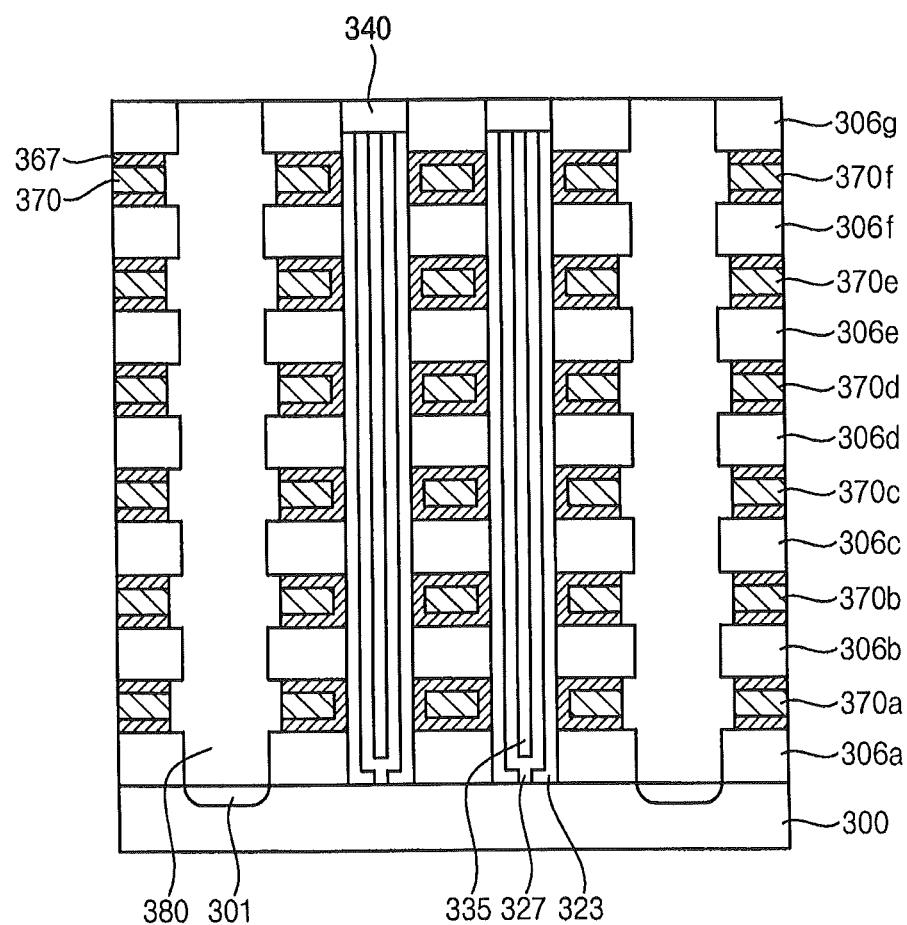

Referring to FIG. 19, an impurity region 301 may be formed at an upper portion of the substrate 300 exposed by the opening 350, and a second filling layer pattern 380 filling the opening 350 may be formed on the impurity region 301.

In some embodiments, an ion implantation mask (not illustrated) covering the pads 340 may be formed on the uppermost insulating interlayer pattern 306g. N-type impurities such as phosphorous (P) and/or arsenic (As) may be implanted through the opening 350 to form the impurity region 301. The impurity region 301 may serve as a common source line (CSL) of the vertical memory device. In some embodiments, a metal silicide pattern, e.g., a cobalt silicide pattern or a nickel silicide pattern may be further formed on the impurity region 301.

A second filling layer may be formed on the substrate 300, the uppermost insulating interlayer pattern 306g and the pad 340 to fill the openings 350. An upper portion of the second filling layer may be planarized by, e.g., a CMP process or an etch-back process until the uppermost insulating interlayer pattern 306g is exposed to form the second filling layer pattern 380. The second filling layer may be formed using an insulation material, e.g., silicon oxide by, e.g., a CVD process.

Figure 20:
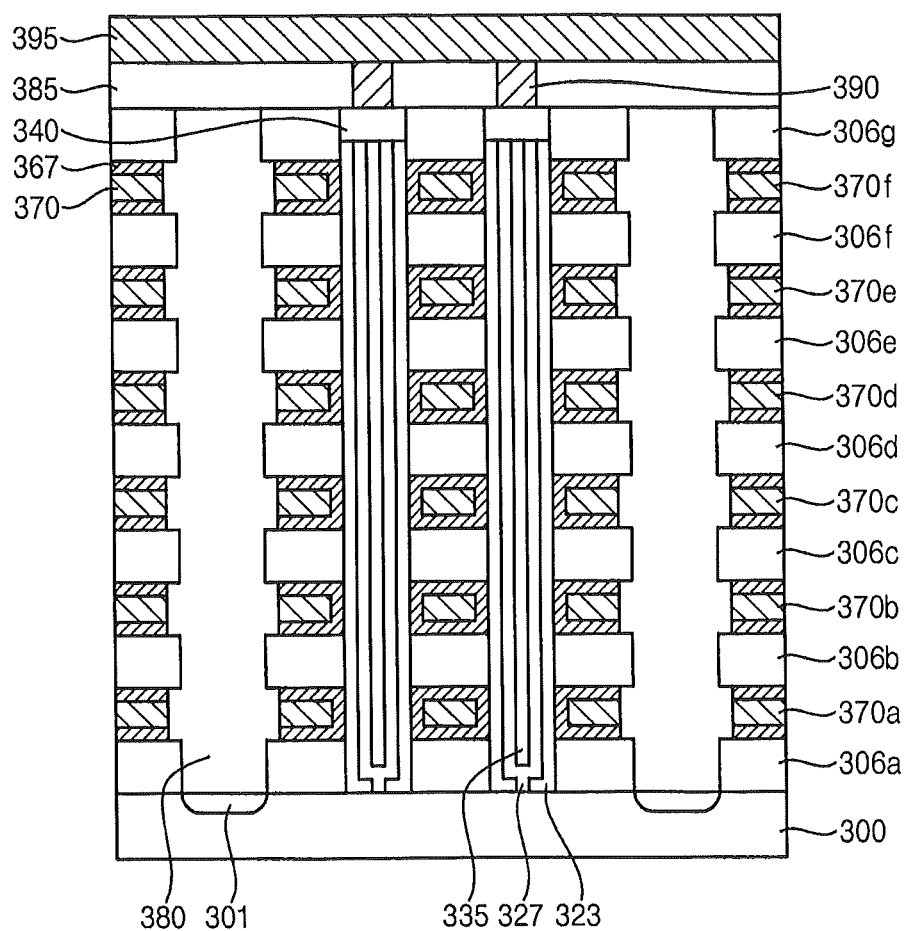

Referring to FIG. 20, an upper insulation layer 385 may be formed on the uppermost insulating interlayer pattern 306g, the second filling layer pattern 380 and the pad 340. The upper insulation layer 385 may be formed using an insulation material, e.g., silicon oxide by, e.g., a CVD process or a spin coating process.

In some embodiments, the second filling layer may be formed to fill the openings 350 and cover the uppermost insulating interlayer pattern 306g and the pad 340. In this case, the formation of the upper insulation layer 385 may be omitted.

A bit line contact 390 may be formed through the upper insulation layer 385 to contact the pad 340. A bit line 395 may be formed on the upper insulation layer 385 to be electrically connected to the bit line contact 390. The bit line contact 390 and the bit line 395 may be formed using a metal, a metal nitride or doped polysilicon by a PVD process, an ALD process or a sputtering process.

A plurality of the bit line contacts 390 may be formed according to an arrangement of the pads 340 to form a bit line contact array. The bit line 395 may be electrically connected to a plurality of the pads 340 via the bit line contacts 390.

FIGS. 21 to 28 are cross-sectional views illustrating a method of manufacturing a semiconductor device according to various embodiments of the present inventive concepts. For example, FIGS. 21 to 28 illustrate a method of manufacturing a semiconductor device including a damascene gate.

Figure 21:
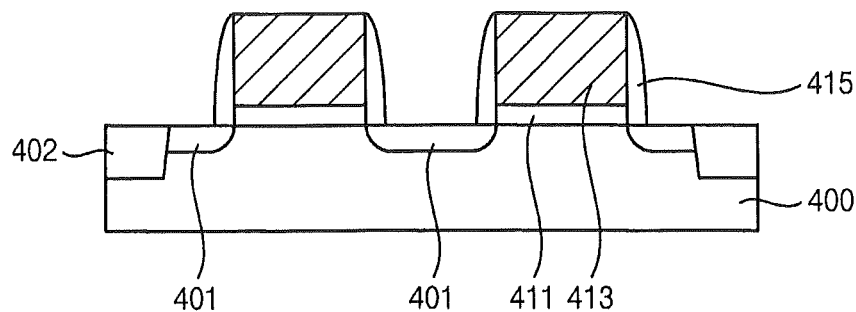
FIGS. 21 to 28 are cross-sectional views illustrating a method of manufacturing a semiconductor device according to various embodiments of the present inventive concepts.

Referring to FIG. 21, a dielectric layer pattern 411 and a dummy gate electrode 413 may be formed on a substrate 400.

The substrate 400 may be a semiconductor substrate including single crystalline silicon or single crystalline germanium. An isolation layer 402 may be formed at an upper portion of the substrate 400 by, e.g., a shallow trench isolation (STI) process, such that the substrate 400 may be divided into an active region and a field region.

In some embodiments, a dielectric layer and a dummy gate electrode layer may be sequentially formed on the substrate 400, and then may be patterned by, e.g., a photolithography process to form the dielectric layer pattern 411 and the dummy gate electrode 413.

The dielectric layer may have a multi-stacked structure including a tunnel insulation layer, a charge storage layer and a first blocking layer. In some embodiments, the dielectric layer may have an ONO layer structure. The dummy gate electrode layer may be formed using polysilicon by a CVD process, a PVD process, a sputtering process, etc.

An impurity region 401 may be formed at upper portions of the substrate 400 adjacent to the dielectric layer pattern 411 by an ion implantation process. A spacer layer covering the dummy gate electrode 413 and the dielectric layer pattern 411 may be formed on the substrate 400. The spacer layer may be anisotropically etched to form a spacer 415 on sidewalls of the dummy gate electrode 413 and the dielectric layer pattern 411. The spacer layer may be formed using silicon nitride by a CVD process or a spin coating process.

Figure 22:
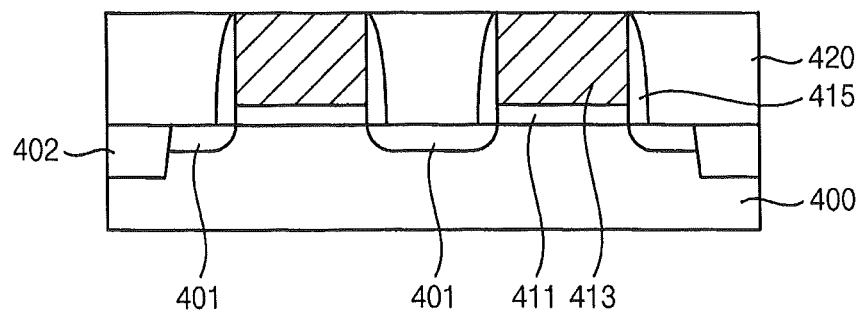

Referring to FIG. 22, a first insulating interlayer 420 covering the dummy gate electrode 413 and the spacer 415 may be formed on the substrate 400. An upper portion of the insulating interlayer 420 may be planarized by, e.g., a CMP process such that a top surface of the dummy gate electrode 413 may be exposed.

The first insulating interlayer 420 may be formed using silicon oxide, e.g., PEOX, BTEOS, PTEOS, BPTEOS, BSG, PSG or BPSG by a CVD process.

Figure 23:
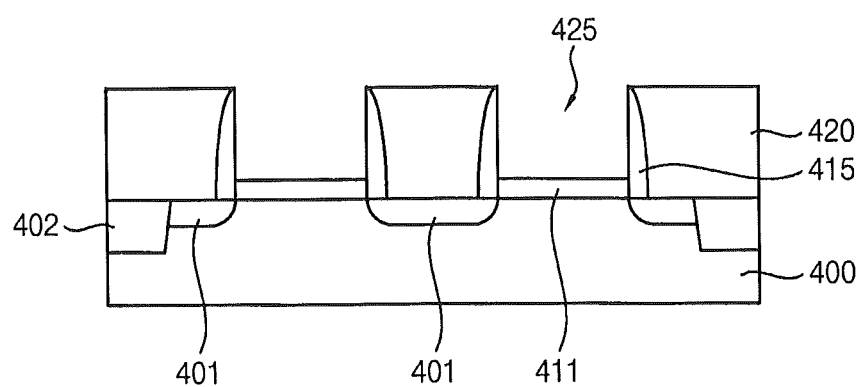

Referring to FIG. 23, the dummy gate electrode 413 may be removed to form an opening 425. A top surface of the dielectric layer pattern 411 may be exposed through the opening 425. The dummy gate electrode 413 may be removed by a wet etching process or a dry etching process. In some embodiments, the dummy gate electrode 413 may be removed by the wet etching process using an etchant solution that may contain ammonium hydroxide.

Figure 24:
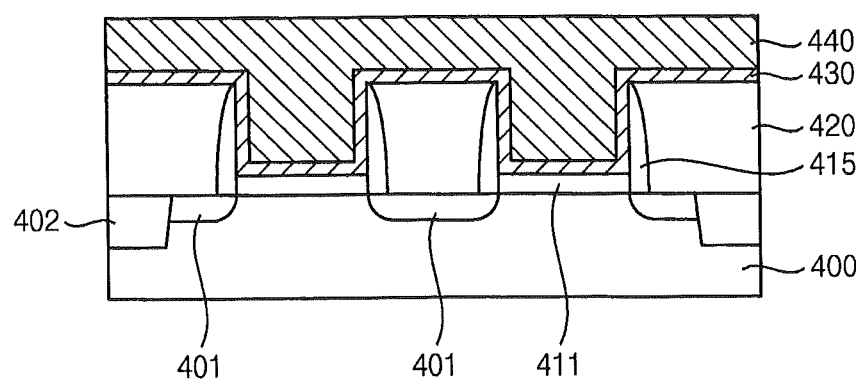

Referring to FIG. 24, a barrier conductive layer 430 may be formed on a top surface of the first insulating interlayer 420, an innerwall of the opening 425 and a top surface of the dielectric layer pattern 411, and a gate electrode layer 440 may be formed on the barrier conductive layer 430 to fill the opening 425.

In some embodiments, the barrier conductive layer 430 and the gate electrode layer 440 may be formed using a metal nitride and a metal, respectively. In some embodiments, the barrier conductive layer 430 and the gate electrode layer 440 may be formed using titanium nitride and tungsten, respectively. The barrier conductive layer 430 and the gate electrode layer 440 may be formed by a sputtering process, a PVD process, an ALD process, etc.

In some embodiments, a second blocking layer (not illustrated) may be further formed before forming the barrier conductive layer 430.

Figure 25:
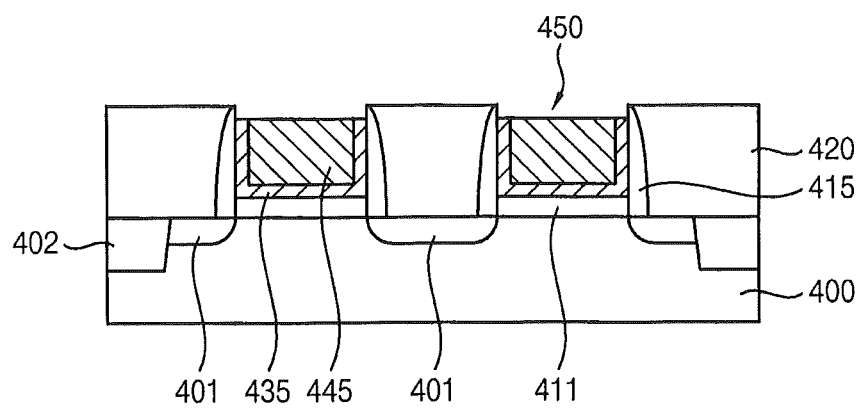

Referring to FIG. 25, a process substantially the same as or similar to that illustrated with reference to FIG. 8 may be performed. Accordingly, upper portions of the barrier conductive layer 430 and the gate electrode layer 440 may be removed using an etchant composition according to various embodiments of the present inventive concepts, as described above, to form a barrier conductive layer pattern 435 and a gate electrode 445.

As described above, in some embodiments, the etchant composition may have substantially the same etching rate for the metal nitride and the metal. Thus, in some embodiments, top surfaces of the barrier conductive layer pattern 435 and the gate electrode 445 may be substantially coplanar with each other.

In some embodiments, portions of the barrier conductive layer 430 and the gate electrode layer 440 formed in the opening 425 may be partially removed to form a recess 450.

Figure 26:
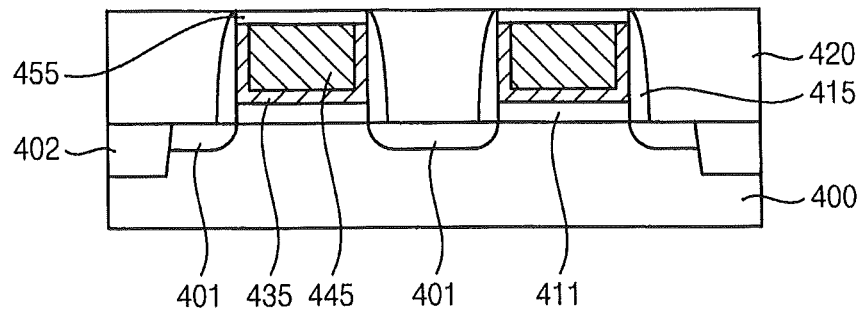

Referring to FIG. 26, a gate mask 455 filling the recess 450 may be formed on the barrier conductive layer pattern 435 and the gate electrode 445.

In some embodiments, a mask layer filling the recess 450 may be formed on the first insulating interlayer 420 using silicon nitride. The mask layer may be planarized by a CMP process until the top surface of the first insulating interlayer 420 is exposed to form the gate mask 455.

Figure 27:
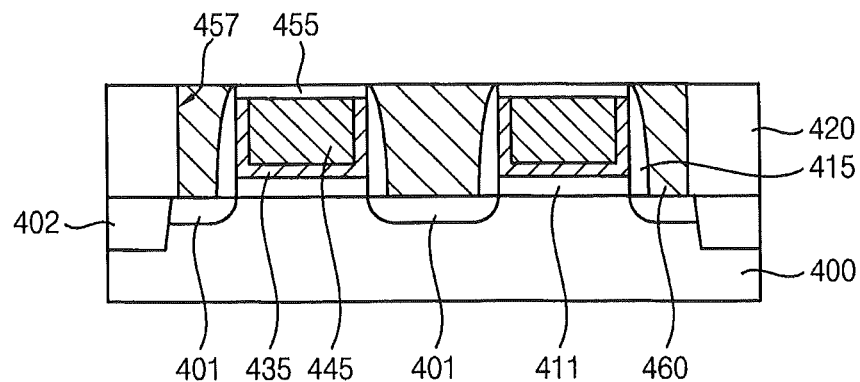

Referring to FIG. 27, a first plug 460 may be formed through the first insulating interlayer 420 to be in contact with the impurity region 401.

In some embodiments, the first insulating interlayer 420 may be partially removed to form a first contact hole 457 through which the impurity region 401 may be exposed. The first contact hole 457 may be self-aligned by the spacer 415. A first conductive layer filling the first contact hole 457 may be formed on the first insulating interlayer 420. The first conductive layer may be planarized until the top surface of the first insulating interlayer 420 is exposed to form the first plug 460.

Figure 28:
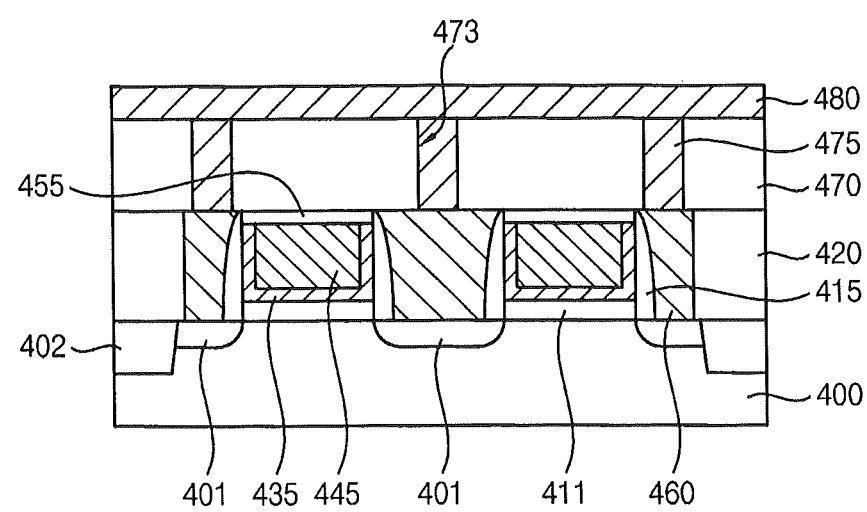

Referring to FIG. 28, a second insulating interlayer 470 covering the first plug 460 and the gate mask 455 may be formed on the first insulating interlayer 420. The second insulating interlayer 470 may be formed using silicon oxide substantially the same as or similar to that of the first insulating interlayer 420. The second insulating interlayer 470 may be formed by a CVD process or spin coating process.

The second insulating interlayer 470 may be partially removed to form a second contact hole 473 through which the first plug 460 may be exposed. A second conductive layer filling the second contact hole 473 may be formed on the second insulating interlayer 470. An upper portion of the second conductive layer may be planarized until a top surface of the second insulating interlayer 470 is exposed to form a second plug 475 electrically connected to the first plug 460.

In some embodiments, a third conductive layer may be formed on the second insulating interlayer 470, and may be patterned to form a conductive line 480 electrically connected to the second plug 475. In some embodiments, the conductive line 480 may serve as a bit line.

The first to third conductive layers may be formed using a metal and/or a metal nitride by a sputtering process, an ALD process, etc.

By performing the processes described above, the semiconductor device including the damascene gate may be obtained. The semiconductor device may be provided as a flash memory device having a planar structure.

Hereinafter, etching properties of etchant compositions according to various embodiments of the present inventive concepts are described in further detail with reference to the Examples.

EXAMPLES

Example 1

Evaluation on Etching Properties of Etchant Compositions

Etchant compositions including phosphoric acid, nitric acid, ammonium persulfate as an assistant oxidant and water were prepared. Etchant compositions of Example 1 and Example 2 were prepared with various contents of the etchant components as provided in Table 1. A comparative etchant composition including phosphoric acid, nitric acid and acetic acid was prepared and is provided in the Comparative Example in Table 2.

A titanium nitride (TiN) layer and a tungsten (W) layer having the same thickness were formed on a silicon substrate. The titanium nitride layer and the tungsten layer were etched by a wet etching process using the etchant compositions of Examples 1 and 2 and the Comparative Example at a temperature of 70° C. Etching rates of the titanium nitride layer and the tungsten layer were measured with various exposure times to the etchant compositions.

The measured results are provided in Tables 1 and 2 below.

TABLE 1

| | Contents (wt %) | | | | Exposure | Etching Rate | | Selectivity |
| | Phosphoric Acid | Nitric Acid | Ammonium Persulfate | Water | Time (hr) | (Å/min) | | (TiN/W) |
| | | | | | | TiN | W | |
| --- | --- | --- | --- | --- | --- | --- | --- | --- |
| Example 1 | 65 | 15 | 1 | 19 | — | 7.67 | 8.87 | 0.86 |
| | | | | | 3 | 7.04 | 8.50 | 0.83 |

TABLE 1-continued

| | Contents (wt %) | | | | Exposure Time (hr) | Etching Rate (Å/min) | | Selectivity (TiN/W) |
| | Phosphoric Acid | Nitric Acid | Ammonium Persulfate | Water | | TiN | W | |
|---|---|---|---|---|---|---|---|---|
| | | | | | 6 | 7.25 | 7.75 | 0.93 |
| | | | | | 9 | 6.80 | 7.21 | 0.94 |
| | | | | | 12 | 6.24 | 6.81 | 0.92 |
| | | | | | 15 | 6.34 | 6.64 | 0.95 |
| | | | | | 18 | 6.12 | 6.27 | 0.98 |
| | | | | | 21 | 6.02 | 5.84 | 1.03 |
| | | | | | 24 | 5.71 | 5.23 | 1.09 |
| Example 2 | 65 | 14.7 | 0.1 | 20.2 | — | 6.87 | 7.53 | 0.91 |
| | | | | | 3 | 6.85 | 7.48 | 0.92 |
| | | | | | 6 | 6.80 | 7.52 | 0.90 |
| | | | | | 9 | 6.81 | 7.55 | 0.90 |
| | | | | | 12 | 6.85 | 7.40 | 0.93 |
| | | | | | 15 | 6.48 | 6.92 | 0.94 |
| | | | | | 18 | 6.34 | 6.51 | 0.97 |
| | | | | | 21 | 6.02 | 5.74 | 1.05 |
| | | | | | 24 | 5.98 | 5.69 | 1.05 |

TABLE 2

| | Contents (wt %) | | | | Exposure Time (hr) | Etching Rate (Å/min) | | Selectivity (TiN/W) |
| | Phosphoric Acid | Nitric Acid | Acetic Acid | Water | | TiN | W | |
|---|---|---|---|---|---|---|---|---|
| Comparative Example | 72 | 1.9 | 13.6 | 12.5 | — | 6.58 | 6.47 | 1.02 |
| | | | | | 3 | 6.67 | 6.36 | 1.05 |
| | | | | | 6 | 6.49 | 6.21 | 1.04 |
| | | | | | 9 | 5.32 | 4.59 | 1.16 |
| | | | | | 12 | 4.19 | 2.47 | 1.70 |
| | | | | | 15 | 4.13 | 2.34 | 1.76 |
| | | | | | 18 | 3.98 | 2.02 | 1.97 |
| | | | | | 21 | 4.01 | 1.92 | 2.09 |
| | | | | | 24 | 3.83 | 1.86 | 2.06 |

Figure 29:
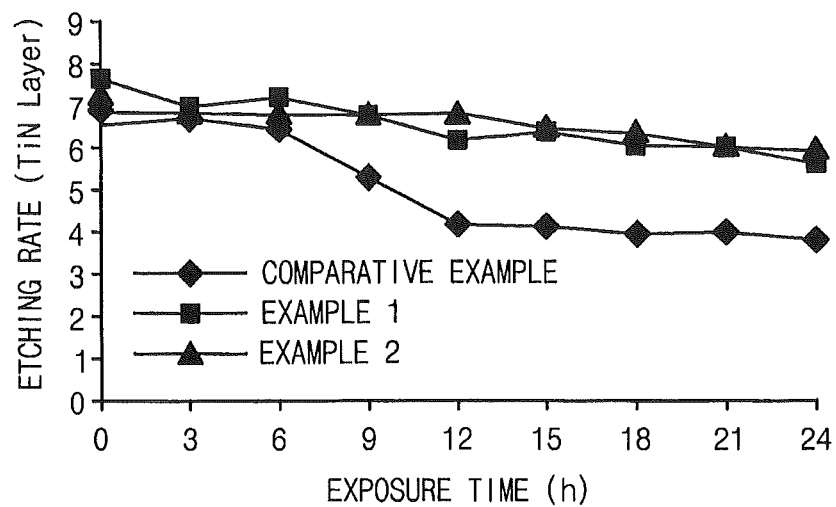
FIG. 29 is a graph showing etching rates for a titanium nitride layer using etchant compositions according to various embodiments of the present inventive concepts.
Figure 30:
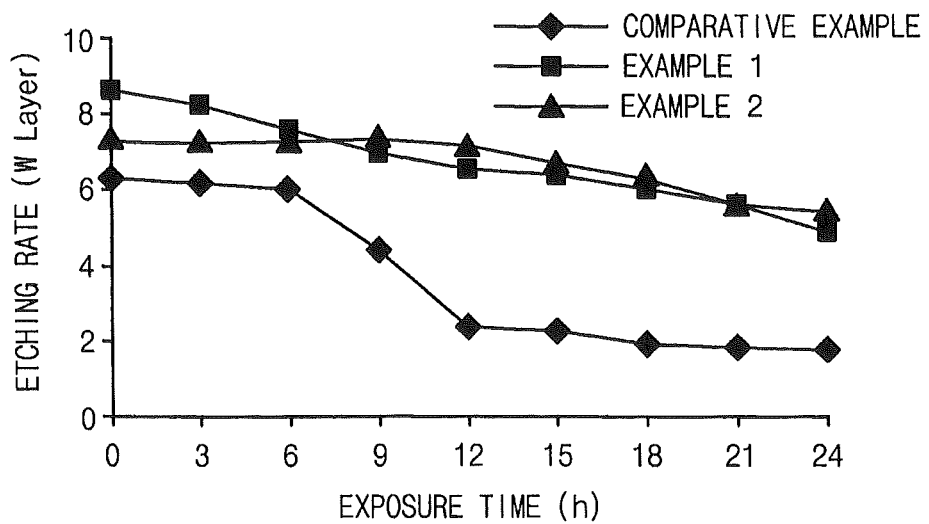
FIG. 30 is a graph showing etching rates for a tungsten layer using etchant compositions according to various embodiments of the present inventive concepts.

FIGS. 29 and 30 are graphs showing etching rates for the titanium nitride layer and the tungsten layer, respectively, using the etchant compositions of Examples 1 and 2 and the Comparative Example.

Referring to Table 1 and FIGS. 29 and 30, the etching rates of the titanium nitride layer and the tungsten layer were not significantly decreased even after 24 hours. Further, an etching selectivity for the titanium nitride layer and the tungsten layer was maintained at about 1.

However, for the Comparative Example in which acetic acid was used instead of an assistant oxidant, the etching rates of the titanium nitride layer and the tungsten layer were drastically decreased after about 6 hours. Further, an etching selectivity was significantly increased after about 9 hours.

Thus, it may be acknowledged that the etchant compositions of the Comparative Example had life-times less than or smaller than those of Examples 1 and 2. Further, the etchant composition of the Comparative Example had different etching rates for titanium nitride layer and the tungsten layer, and thus uniform etching selectivity was not achieved.

According to example embodiments of the present inventive concepts, at least two different conductive layers may be etched using an etchant composition according to various embodiments of the present inventive concepts, as described above, with substantially the same etching rate. Thus, a conductive pattern having a uniform surface may be obtained. The conductive pattern may be implemented in conductive structures of semiconductor devices, e.g., a gate electrode, a wiring structure, a contact structure, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. In the claims, means-plus-function clauses, if present, are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of forming a conductive pattern, comprising:
    forming a first conductive layer and a second conductive layer on a substrate, the first conductive layer including a metal nitride having a first metal and the second conductive layer including a second metal, wherein the first metal is different than the second metal, and wherein the metal nitride in the first conductive layer is titanium nitride and the second metal in the second conductive layer is tungsten;

etching the first conductive layer and the second conductive layer using an etchant composition that includes phosphoric acid, nitric acid, an assistant oxidant and water, the etchant composition having substantially the same etching rate for the metal nitride and the second metal; and wherein hydrogen peroxide, acetic acid, a hydroxide and fluoric acid are not present in the etchant composition.

2. The method of claim 1, wherein the etchant composition includes:

phosphoric acid in an amount in a range of about 50 weight percent to about 80 weight percent, based on a total weight of the etchant composition;

nitric acid in an amount in a range of about 5 weight percent to about 20 weight percent, based on the total weight of the etchant composition;

the assistant oxidant in an amount in a range of about 0.01 weight percent to about 10 weight percent, based on the total weight of the etchant composition; and water in an amount of a remaining weight percent, based on the total weight of the etchant composition.

3. The method of claim 1, wherein the assistant oxidant includes at least one selected from an acid ammonium-based compound, a halogen acid compound and a sulfuric acid-based compound.

4. The method of claim 3, wherein the assistant oxidant includes at least one selected from ammonium sulfate, ammonium persulfate, ammonium acetate, ammonium phosphate, ammonium chloride, periodic acid, iodic acid, sulfuric acid, methanesulfonic acid and paratoluene sulfonic acid.

5. The method of claim 1, wherein a conductive pattern including a first conductive layer pattern and a second conductive layer pattern is formed by etching the first conductive layer and the second conductive layer, and wherein sidewalls of the first conductive layer pattern and the second conductive layer pattern extend on substantially the same plane.

6. The method of claim 1, further comprising, prior to forming the first conductive layer and the second conductive layer on the substrate, forming an insulation layer pattern using silicon oxide on the substrate, the insulation layer pattern including an opening, and wherein forming the first conductive layer and the second conductive layer on the substrate comprises forming the first conductive layer on surfaces of the insulation layer pattern and an innerwall of the opening, and forming the second conductive layer on the first conductive layer to fill the opening.

7. The method of claim 6, wherein etching the first conductive layer and the second conductive layer comprises etching upper portions of the first conductive layer and the second conductive layer to form a first conductive layer pattern and a second conductive layer pattern, and wherein the first conductive layer pattern surrounds a sidewall and a bottom of the second conductive layer pattern.

8. The method of claim 7, wherein the first conductive layer pattern and the second conductive layer pattern partially fill the opening such that a recess is formed at an upper portion of the opening.

9. The method of claim 8, wherein top surfaces of the first conductive layer pattern and the second conductive layer pattern are coplanar with each other.

10. A method of manufacturing a semiconductor device, comprising:

forming insulating interlayers and sacrificial layers alternately and repeatedly on a substrate;

forming a plurality of channels through the insulating interlayers and the sacrificial layers;

partially removing the insulating interlayers and the sacrificial layers to form an opening between adjacent channels of the plurality of channels;

removing the sacrificial layers exposed by the opening to form a plurality of gaps spaced apart from each other in a vertical direction to a top surface of the substrate;

forming a barrier conductive layer including a metal nitride having a first metal on surfaces of the insulating interlayers and innerwalls of the plurality of gaps;

forming a gate electrode layer including a second metal on the barrier conductive layer to fill the plurality of gaps;

etching the barrier conductive layer and the gate electrode layer using an etchant composition that includes phosphoric acid, nitric acid, an assistant oxidant and water, the etchant composition having substantially the same etching rate for the metal nitride and the second metal, wherein the first metal is different than the second metal, wherein the barrier conductive layer is formed using titanium nitride, and the gate electrode layer is formed using tungsten, and wherein hydrogen peroxide, acetic acid, a hydroxide and fluoric acid are not present in the etchant composition.

11. The method of claim 10, wherein a barrier conductive layer pattern and a gate electrode that at least partially fill a gap of the plurality of gaps are formed by etching the barrier conductive layer and the gate electrode layer, and wherein sidewalls of the barrier conductive layer pattern and the gate electrode extend on substantially the same plane.

12. The method of claim 11, further comprising forming a recess at a portion of a gap of the plurality of gaps, and forming a filling layer pattern that fills the opening and the recess.

13. A method of forming a conductive pattern, comprising:

etching a first conductive layer including a first metal, wherein the first metal is tungsten, and a second conductive layer including a metal nitride, wherein the metal nitride is titanium nitride, having a second metal with an etchant composition comprising:

phosphoric acid in an amount in a range of about 65 weight percent to about 80 weight percent, based on a total weight of the etchant composition;

nitric acid in an amount in a range of about 5 weight percent to about 20 weight percent, based on the total weight of the etchant composition;

an assistant oxidant in an amount in a range of about 0.01 weight percent to about 10 weight percent, based on the total weight of the etchant composition, wherein the etchant composition further comprises water, wherein hydrogen peroxide, acetic acid, a hydroxide and fluoric acid are not present in the etchant composition, wherein the etchant composition etches the metal nitride and the first metal at substantially the same etching rate, and wherein the first metal is different than the second metal.

14. The method of claim 13, wherein etching the first conductive layer and the second conductive layer comprises etching the metal nitride and first metal at an etching rate ratio in a range of about 0.8 to about 1.1 (metal nitride:first metal).

* * * * *